US012673891B2

(12) United States Patent
Li

(10) Patent No.: US 12,673,891 B2
(45) Date of Patent: **\*Jul. 7, 2026**

(54) USE OF MgO, ZnO, AND RARE EARTH OXIDES FOR MAKING IMPROVED LOW DIELECTRIC FIBERS WITH IMPROVED LOW THERMAL EXPANSION COEFFICIENT FOR HIGH BORON ALUMINOSILICATE COMPOSITIONS

(71) Applicant: Electric Glass Fiber America, LLC., Shelby, NC (US)

(72) Inventor: Hong Li, Stanley, NC (US)

(73) Assignee: Electric Glass Fiber America, LLC, Shelby, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/475,424

(22) Filed: Sep. 27, 2023

(65) Prior Publication Data

US 2024/0018034 A1     Jan. 18, 2024

Related U.S. Application Data

(63) Continuation of application No. 16/600,769, filed on Oct. 14, 2019, now Pat. No. 11,787,732, which is a continuation of application No. 15/573,181, filed as application No. PCT/US2016/031740 on May 11, 2016, now Pat. No. 10,479,721.

(60) Provisional application No. 62/160,709, filed on May 13, 2015.

(51) Int. Cl.
| | |
|---|---|
| *C03C 13/00* | (2006.01) |
| *C03C 3/091* | (2006.01) |
| *C03C 3/093* | (2006.01) |
| *C03C 3/118* | (2006.01) |
| *C03C 13/06* | (2006.01) |
| *H05K 1/03* | (2006.01) |

(52) U.S. Cl.
CPC .............. *C03C 13/00* (2013.01); *C03C 3/091* (2013.01); *C03C 3/093* (2013.01); *C03C 3/118* (2013.01); *C03C 13/06* (2013.01); *H05K 1/0306* (2013.01); *C03C 2213/00* (2013.01); *H05K 2201/0275* (2013.01)

(58) Field of Classification Search
CPC ......... C03C 13/00; C03C 13/06; C03C 3/112; C03C 3/115; C03C 3/118; C03C 3/091; C03C 3/093; H05K 2201/0275; H05K 1/0306
See application file for complete search history.

(56) References Cited

U.S. PATENT DOCUMENTS

| | | | |
|---|---|---|---|
| 3,053,672 A | 9/1962 | Labino | |
| 5,958,808 A | 9/1999 | Mori et al. | |
| 6,043,171 A | 3/2000 | Siebers et al. | |
| 6,525,300 B1 | 2/2003 | Mitra et al. | |
| 10,479,721 B2 | 11/2019 | Li | |
| 11,787,732 B2 | 10/2023 | Li | |
| 2003/0054936 A1 | 3/2003 | Tamura | |
| 2004/0175557 A1 | 9/2004 | Creux et al. | |
| 2005/0107238 A1 | 5/2005 | Li | |
| 2008/0103036 A1 | 5/2008 | Boessneck et al. | |
| 2012/0095149 A1 | 4/2012 | Sawanoi et al. | |
| 2015/0344352 A1 | 12/2015 | Yang et al. | |
| 2018/0127305 A1 | 5/2018 | Li | |

FOREIGN PATENT DOCUMENTS

| | | | | |
|---|---|---|---|---|
| CN | 1092614 C | | 10/2002 | |
| CN | 1511120 A | | 7/2004 | |
| CN | 101012105 A | | 8/2007 | |
| CN | 101696089 A | * | 4/2010 | |
| CN | 101012105 B | | 5/2010 | |
| CN | 102333735 A | | 1/2012 | |
| CN | 102503153 A | * | 6/2012 | ............ C03C 3/091 |
| CN | 102718406 A | | 10/2012 | |
| CN | 103482876 A | | 1/2014 | |
| CN | 103992039 A | | 8/2014 | |
| CN | 104556709 A | | 4/2015 | |
| JP | 62226839 A | | 10/1987 | |
| JP | 08333137 A | | 12/1996 | |
| JP | 0974255 A | | 3/1997 | |

(Continued)

OTHER PUBLICATIONS

JP2022-163164 , "Office Action", Sep. 29, 2023, 2 pages.
TW111147630 , "Office Action", Feb. 2, 2024, 11 pages.
U.S. Appl. No. 15/573,181 , "Advisory Action", Jun. 6, 2019, 3 pages.
U.S. Appl. No. 15/573,181 , "Corrected Notice of Allowability", Sep. 12, 2019, 4 pages.
U.S. Appl. No. 15/573,181 , "Final Office Action", Feb. 25, 2019, 11 pages.
U.S. Appl. No. 15/573,181 , "Non-Final Office Action", Sep. 21, 2018, 8 pages.
U.S. Appl. No. 15/573,181 , "Notice of Allowance", Jul. 15, 2019, 9 pages.

(Continued)

*Primary Examiner* — Elizabeth A. Bolden
(74) *Attorney, Agent, or Firm* — Kilpatrick Townsend & Stockton, LLP

(57)     ABSTRACT

New glass compositions and applications thereof are disclosed. A glass composition as described herein can include 50 to 55 weight percent $SiO_2$, 17 to 26 weight percent $B_2O_3$, 13 to 19 weight percent $Al_2O_3$, 0 to 8.5 weight percent MgO, 0 to 7.5 weight percent ZnO, 0 to 6 weight percent CaO, 0 to 1.5 weight percent $Li_2O$, 0 to 1.5 weight percent $F_2$, 0 to 1 weight percent $Na_2O$, 0 to 1 weight percent $Fe_2O_3$, 0 to 1 weight percent $TiO_2$, and 0 to 8 weight percent of other constituents. Also described herein are glass fibers formed from such compositions, composites, and articles of manufacture comprising the glass compositions and/or glass fibers.

20 Claims, No Drawings

(56)                References Cited

FOREIGN PATENT DOCUMENTS

| JP | 10167759 A | 6/1998 |
| JP | 11292567 A | 10/1999 |
| JP | 2000233942 A | 8/2000 |
| JP | 2004107112 A | 4/2004 |
| JP | 2004525066 A | 8/2004 |
| JP | 2009286686 A | 12/2009 |
| JP | 2010508226 A | 3/2010 |
| JP | 2010260781 A | 11/2010 |
| JP | 2016098118 A | 5/2016 |
| TW | 201708147 | 3/2017 |
| WO | 2015009686 A1 | 1/2015 |
| WO | 2016183133 A1 | 11/2016 |

OTHER PUBLICATIONS

U.S. Appl. No. 16/600,769 , "Corrected Notice of Allowability", Jun. 26, 2023, 3 pages.
U.S. Appl. No. 16/600,769 , "Final Office Action", Feb. 17, 2023, 6 pages.
U.S. Appl. No. 16/600,769 , "Non-Final Office Action", Apr. 1, 2022, 11 pages.
U.S. Appl. No. 16/600,769 , "Notice of Allowance", Jun. 13, 2023, 10 pages.
CN Application No. 201680035789.1 , "Office Action", Oct. 19, 2020, 12 pages.
CN Application No. 201680035789.1 , "Office Action", Apr. 9, 2020, 14 pages.
CN Application No. 201680035789.1 , "Office Action", Mar. 24, 2023, 16 pages.
CN Application No. 201680035789.1 , "Office Action", Mar. 22, 2021, 17 pages.
CN Application No. 201680035789.1 , "Office Action", Dec. 11, 2020, 22 pages.
JP Application No. 2017-558677 , "Notice of Allowance", Nov. 29, 2021, 5 pages.
JP Application No. 2017-558677 , "Office Action", Jul. 9, 2020, 6 pages.
JP Application No. 2017-558677 , "Office Action", May 26, 2021, 7 pages.
JP Application No. 2021-002730 , "Office Action", Jun. 10, 2022, 3 pages.
JP Application No. 2021-002730 , "Office Action", Nov. 30, 2021, 4 pages.
International Application No. PCT/US2016/031740 , "International Preliminary Report on Patentability", Nov. 23, 2017, 6 pages.
International Application No. PCT/US2016/031740 , "International Search Report and Written Opinion", Aug. 11, 2016, 9 pages.
TW Application No. 105114632 , "Notice of Decision to Grant", May 5, 2020, 3 pages.
TW Application No. 105114632 , "Office Action", Nov. 15, 2019, 4 pages.
TW Application No. 105114632 , "Office Action", Feb. 17, 2020, 6 pages.
TW Application No. 109126717 , "Notice of Decision to Grant", Sep. 7, 2022, 3 pages.
TW Application No. 109126717 , "Office Action", Oct. 1, 2021, 11 pages.
Xinhua et al., "Glassware Production Technology", Chemical Industry Press, Jan. 2007, p. 37.
Xinhua et al., "Production Techniques of Glass Vessels", Chemical Industry Press, Jan. 31, 2007, 3 pages.
Application No. JP2022-163164 , Office Action, Mailed on Feb. 12, 2025, 3 pages.
Application No. JP2024-57551 , Office Action, Mailed on Apr. 9, 2025, 1 page.

* cited by examiner

USE OF MgO, ZnO, AND RARE EARTH OXIDES FOR MAKING IMPROVED LOW DIELECTRIC FIBERS WITH IMPROVED LOW THERMAL EXPANSION COEFFICIENT FOR HIGH BORON ALUMINOSILICATE COMPOSITIONS

CROSS-REFERENCE TO RELATED APPLICATIONS

This application is a continuation of U.S. patent application Ser. No. 16/600,769, filed Oct. 14, 2019, which is a continuation of U.S. patent application Ser. No. 15/573,181, filed Nov. 10, 2017, which is a national stage entry of PCT Application No. PCT/US16/31740, filed May 11, 2016, which claims the benefit of and priority to U.S. Provisional Patent Application No. 62/160,709, filed May 13, 2015, each of which is hereby incorporated herein by reference in its entirety.

FIELD OF THE INVENTION

The present invention relates to glass compositions and applications thereof. Embodiments include glass compositions for forming fibers, fibers and articles of manufacture including the fibers (e.g. printed circuit boards) with improved electrical performance and thermal stability of printed circuit board.

BACKGROUND OF THE INVENTION

Glass fibers have been used to reinforce various polymeric resins for many years. Some commonly used glass compositions for use in reinforcement applications include the "E-glass" and "D-glass" families of compositions. Another commonly used glass composition is commercially available from AGY (Aiken, South Carolina) under the trade name "L-Glass."

In reinforcement and other applications, certain electrical and thermal properties of glass fibers or of composites reinforced with glass fibers can be important, especially for printed circuit board substrate. However, in many instances, the manufacture of glass fibers having improved electrical and thermal properties (e.g., lower dielectric constant, lower thermal expansion coefficient, etc.) can result in higher costs due, for example, to increased batch material costs, increased manufacturing costs, or other factors. For example, the aforementioned "L-Glass" has improved electrical and thermal properties as compared to conventional E-glass but costs significantly more as well as a result of substantially higher temperature and energy demands for batch-to-glass conversion, melt fining, and fiber drawing. Fiber glass manufacturers continue to seek glass compositions that can be used to form glass fibers having desirable performance related properties in a commercial manufacturing environment.

SUMMARY

Various embodiments of the present invention provide glass compositions, fiberizable glass compositions, glass fibers formed from such compositions, and articles of manufacture comprising the glass compositions and/or glass fibers.

The glass compositions, fiberizable glass compositions and glass fibers in embodiments of the present invention may have one or more of the following advantageous features, for example as compared to current commercially available glass compositions: lower thermal expansion coefficient (CTE) values, lower dielectric constants (Dk), lower melting and forming temperatures, and/or higher glass transition temperatures. Additional benefits of embodiments of the present invention may include increased fiber strength, increased fiber Young's modulus, decreased fiber density, and/or decreased boron emissions. Embodiments of the present invention may be advantageous for printed circuit board applications, among other potential applications. Additional advantages of embodiments of the present invention will be apparent to those of ordinary skill in the art from the descriptions provided herein.

The features and embodiments of the present invention are described in greater detail in the Detailed Description that follows.

DETAILED DESCRIPTION

Unless indicated to the contrary, the numerical parameters set forth in the following specification are approximations that can vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more, e.g. 1 to 6.1, and ending with a maximum value of 10 or less, e.g., 5.5 to 10. Additionally, any reference referred to as being "incorporated herein" is to be understood as being incorporated in its entirety.

As used herein, the term "substantially free" refers to any amount of the component present in the glass composition as resulting from the component being present as a trace impurity in a batch material and would only be present in amounts of about 0.2 weight percent or less (e.g., 0.1 weight percent or less, 0.05 weight percent or less, 0.01 weight percent or less, or 0.005 weight percent or less).

It is further noted that, as used in this specification, the singular forms "a," "an," and "the" include plural referents unless expressly and unequivocally limited to one referent.

Embodiments of the present invention include glass compositions. In an aspect, the present invention provides glass fibers formed from glass compositions described herein. In some embodiments, glass fibers of the present invention can have improved mechanical properties, such as lower dielectric constants and lower thermal expansion coefficients, as compared to L-Glass fibers. In addition, the compositions have improved properties such as lower melting and forming temperatures and higher glass transition temperatures.

In some embodiments, a glass composition of the present invention is suitable for fiber forming and comprises from about 50 to about 55 weight percent $SiO_2$, from about 17 to about 26 weight percent $B_2O_3$, from about 13 to about 19 weight percent $Al_2O_3$, from about 0 to about 8.5 weight percent MgO, from about 0 to about 7.5 weight percent ZnO, from about 0 to about 6 weight percent CaO, from about 0 to about 1.5 weight percent $Li_2O$, from about to about 1.5 weight percent $F_2$, from about 0 to about 1 weight percent $Na_2O$, from about 0 to about 1 weight percent $Fe_2O_3$, from about 0 to about 1 weight percent $TiO_2$, and from about 0 to about 8 weight percent of other constituents, all based on the weight of the glass composition.

Some embodiments of the invention can be characterized by the amount of $SiO_2$ present in the glass compositions. In some embodiments, $SiO_2$ can be present in an amount from about 50 to about 55 weight percent based on the weight of the glass composition. In some embodiments, $SiO_2$ can be from about 51 to about 54 weight percent. The $SiO_2$ content, in some embodiments, can be from about 52 to about 54 weight percent. The $SiO_2$ content, in some embodiments, can be from greater than 52 to about 53.5 weight percent.

Some embodiments of the invention can be characterized by the amount of $B_2O_3$ present in the glass compositions. In some embodiments, $B_2O_3$ can be present in an amount from about 17 to about 26 weight percent, based on the weight of the glass composition. In some embodiments, the $B_2O_3$ content can be from about 17.5 to about 25 weight percent. The $B_2O_3$ content, in some embodiments, can be from about 19 to about 24 weight percent. The $B_2O_3$ content, in some embodiments, can be from about 17.5 to about 22 weight percent. The $B_2O_3$ content, in some embodiments, can be from about 22 to about 26 weight percent.

Some embodiments of the invention can be characterized by the amount of $Al_2O_3$ present in the glass compositions. In some embodiments, $Al_2O_3$ can be present in an amount from about 13 to about 19 weight percent, based on the weight of the glass composition. In some embodiments, the $Al_2O_3$ content can be from about 14 to about 18 weight percent. In some embodiments, $Al_2O_3$ can be present in an amount from greater than 13 to about 16 weight percent. In some embodiments, $Al_2O_3$ can be present in an amount from about 16 to about 18.5 weight percent.

Some embodiments of the invention can be characterized by the amount of MgO present in the glass compositions. In some embodiments, the MgO content can be about 8.5 weight percent or less, based on the weight of the glass composition. In some embodiments, MgO can be from greater than 0 to about 8.5 weight percent. In some embodiments, MgO can be from greater than 0 to about 7.5 weight percent. The MgO content can be from about 1 to about 8.5 weight percent in some embodiments. The MgO content can be from about 2 to about 8.5 weight percent in some embodiments. The MgO content can be from about 2 to about 8 weight percent in some embodiments. The MgO content can be from about 3 to about 7 weight percent in some embodiments. In some embodiments, the MgO content can be 1 weight percent or less.

Some embodiments of the invention can be characterized by the combined content of $Al_2O_3$ and MgO (i.e., $Al_2O_3+$MgO) present in the glass compositions. The $Al_2O_3+$MgO content in some embodiments can be at least about 14 weight percent, based on the weight of the glass composition. In some embodiments, the $Al_2O_3+$MgO content can be from about 14 to about 26.5 weight percent. In some embodiments, the $Al_2O_3+$MgO content can be from about 14 to about 26 weight percent. In some embodiments, the $Al_2O_3+$MgO content can be from about 14 to about 21 weight percent. In some embodiments, the $Al_2O_3+$MgO content can be from about 20 to about 26.5 weight percent.

Some embodiments of the invention can be characterized by the amount of ZnO present in the glass compositions. In some embodiments, the ZnO content can be from about to about 8 weight percent, based on the weight of the glass composition. In some embodiments, the ZnO content can be from about 0 to about 7.5 weight percent. In some embodiments, ZnO can be from greater than 0 to about 5 weight percent. In some embodiments, the ZnO content can be from about 2 to about 7.5 weight percent. In some embodiments, the ZnO content can be from about 2 to about 5.5 weight percent. In some embodiments, the composition can be substantially free from ZnO.

Some embodiments of the invention can be characterized by the combined content of $Al_2O_3$ and ZnO (i.e., $Al_2O_3+$ZnO) present in the glass compositions. The $Al_2O_3+$ZnO content in some embodiments can be at least about 14 weight percent, based on the weight of the glass composition. In some embodiments, the $Al_2O_3+$ZnO content can be from about 14 to about 22 weight percent. In some embodiments, the $Al_2O_3+$ZnO content can be from about 14 to about 20 weight percent. In some embodiments, the $Al_2O_3+$ZnO content can be from about 14.5 to about 18 weight percent.

Some embodiments of the invention can be characterized by the amount of CaO present in the glass compositions. In some embodiments, the CaO content can be from about to about 6 weight percent, based on the weight of the glass composition. In some embodiments, the CaO content can be from greater than 0 to about 5.5 weight percent. In some embodiments, the CaO content can be from greater than 0 to about 4.5 weight percent. In some embodiments, the CaO content can be from about 1.5 to about 5.5 weight percent. In some embodiments, the CaO content can be less than about 1 weight percent. In some embodiments, the composition can be substantially free from CaO.

Some embodiments of the invention can be characterized by the combined content of MgO and CaO (i.e., MgO+CaO) present in the glass compositions. The total MgO+CaO content can be about 9 weight percent or less in some embodiments, based on the weight of the glass composition. The MgO+CaO content, in some embodiments, can be from greater than 0 to about 9 weight percent. The MgO+CaO content, in some embodiments, can be from greater than 0 to about 7.5 weight percent. The MgO+CaO content, in some embodiments, can be from greater than 0 to about 4 weight percent. The MgO+CaO content, in some embodiments, can be from about 2 to about 9 weight percent. The MgO+CaO content, in some embodiments, can be from about 4 to about 8.5 weight percent.

Some embodiments of the invention can be characterized by the amount of $Na_2O$ present in the glass compositions. In some embodiments, the $Na_2O$ content can be about 1 weight percent or less, based on the weight of the glass composition. In some embodiments, the $Na_2O$ content can be about 0.5 weight percent or less. In some embodiments, the $Na_2O$ content can be about 0.1 weight percent or less. In some embodiments, the $Na_2O$ content can be about 0.05 weight percent or less. In some embodiments, $Na_2O$ can be from greater than 0 to about 1 weight percent. In some embodiments, $Na_2O$ can be from greater than 0 to about 0.5 weight percent. In some embodiments, $Na_2O$ can be from greater than 0 to about 0.1 weight percent. In some embodiments, the $Na_2O$ content can be from about 0.04 to about 0.05 weight percent.

Some embodiments of the invention can be characterized by the amount of $Li_2O$ present in the glass compositions. In some embodiments, the $Li_2O$ content can be about 1.5 weight percent or less, based on the weight of the glass composition. In some embodiments, the $Li_2O$ content can be about 1.2 weight percent or less. In some embodiments, the $Li_2O$ content can be about 0.8 weight percent or less. In some embodiments, the $Li_2O$ content can be about 0.5 weight percent or less. In some embodiments, $Li_2O$ can be from greater than 0 to about 1.5 weight percent. In some embodiments, $Li_2O$ can be from greater than 0 to about 0.8 weight percent. In some embodiments, the $Li_2O$ content can be from about 0.4 to about 0.7 weight percent. In some embodiments, the composition can be substantially free from $Li_2O$.

Some embodiments of the present invention can be characterized by the total amount of $Na_2O$ and $Li_2O$ content (i.e., $Na_2O+Li_2O$) present in the composition. In some embodiments, the $Na_2O+Li_2O$ content can be less than about 1.5 weight percent, based on the weight of the glass composition. In some embodiments, the $Na_2O+Li_2O$ content can be less than about 1.2 weight percent. In some embodiments, the $Na_2O+Li_2O$ content can be less than about 0.7 weight percent. In some embodiments, the $Na_2O+Li_2O$ content can be about 0.1 weight percent or less. In some embodiments, the $Na_2O+Li_2O$ content can be from about 0.4 to about 0.7 weight percent.

Some embodiments of the present invention can be characterized by the amount of $F_2$ present in the glass compositions. In some embodiments, the $F_2$ content can be about 1.5 weight percent or less, based on the weight of the glass composition. In some embodiments, $F_2$ can be from greater than 0 to about 1.5 weight percent. $F_2$ can be present, in some embodiments, in an amount from about 0.5 to about 1.5 weight percent. $F_2$ can be present, in some embodiments, in an amount from about 0.9 to about 1.3 weight percent.

Some embodiments of the present invention can be characterized by the amount of $Fe_2O_3$ present in the glass compositions. In some embodiments, the $Fe_2O_3$ content can be about 1 weight percent or less, based on the weight of the glass composition. In some embodiments, the $Fe_2O_3$ content can be about 0.5 weight percent or less. In some embodiments, $Fe_2O_3$ can be from greater than 0 to about 0.5 weight percent. $Fe_2O_3$ can be present, in some embodiments, in an amount from about 0.2 to about 0.4 weight percent.

Some embodiments of the present invention can be characterized by the amount of $TiO_2$ present in the glass compositions. In some embodiments, the $TiO_2$ content can be about 1 weight percent or less, based on the weight of the glass composition. $TiO_2$ can be present, in some embodiments, from greater than 0 to about 0.7 weight percent. $TiO_2$ can be present, in some embodiments, in an amount from about 0.4 to about 1 weight percent. $TiO_2$ can be present, in some embodiments, in an amount from about 0.4 to about 0.7 weight percent. $TiO_2$ can be present, in some embodiments, in an amount from about 0.45 to about 0.6 weight percent.

Some embodiments of the present invention can be characterized by the amount of BaO and/or SrO present in the glass compositions. The compositions may contain small amounts of BaO and/or SrO from impurities; the combined concentration of BaO and SrO in the compositions can be about 0.2 weight percent or less, based on the weight of the glass composition. In some embodiments, the composition can be substantially free from BaO. In some embodiments, the composition can be substantially free from SrO.

Sulfate (expressed as $SO_3$) may also be present as a refining agent. In some embodiments, the composition is substantially free from $SO_3$. Small amounts of impurities may also be present from raw materials or from contamination during the melting processes, such as $Cl_2$, $P_2O_5$, $Cr_2O_3$, or NiO, although not limited to these particular chemical forms. Other refining agents and/or processing aids may also be present such as $As_2O_3$, $MnO_2$, $Sb_2O_3$, or $SnO_2$, although not limited to these particular chemical forms. These impurities and refining agents, when present, are each typically present in amounts less than about 0.5 weight percent, based on the weight of the glass composition.

Some embodiments of the present invention can be characterized by the amount of rare earth oxides ($RE_2O_3$) present in the glass compositions. As understood to those of skill in the art, the term "rare earth oxides" refers to oxides incorporating a rare earth metal and includes oxides of scandium ($Sc_2O_3$), yttrium ($Y_2O_3$), and the lanthanide elements (lanthanum ($La_2O_3$), cerium ($Ce_2O_3$ and $CeO_2$), praseodymium ($Pr_2O_3$), neodymium ($Nd_2O_3$), promethium ($Pm_2O_3$), samarium ($Sm_2O_3$), europium ($Eu_2O_3$ and EuO), gadolinium ($Gd_2O_3$), terbium ($Tb_2O_3$), dysprosium ($Dy_2O_3$), holmium ($Ho_2O_3$), erbium ($Er_2O_3$), thulium ($Tm_2O_3$), ytterbium ($Yb_2O_3$), and lutetium ($Lu_2O_3$)).

The one or more rare earth oxides can be included in some embodiments of glass compositions of the present invention in amounts that exceed those wherein the rare earth oxide is present only as a tramp material or impurity in a batch material included with a glass batch to provide another component. The glass compositions, in some embodiments, can comprise a combination of rare earth oxides (e.g., one or more of various rare earth oxides). In some embodiments, the one or more rare earth oxides comprise at least one of $La_2O_3$, $CeO_2$, $Y_2O_3$ and $Sc_2O_3$.

In some embodiments, glass compositions of the present invention can comprise one or more rare earth oxides ($RE_2O_3$) in an amount greater than about 0.1 weight percent, based on the weight of the glass composition. In some embodiments, the total amount of the one or more rare earth oxides can be about 8 weight percent or less. In some embodiments, the one or more rare earth oxides content can be from greater than 0 to about 8 weight percent. In some embodiments, the one or more rare earth oxides content can be from greater than 0 to about 7.5 weight percent. In some embodiments, the one or more rare earth oxides content can be present in an amount from about 3.5 to about 7.5 weight percent. In some embodiments, the composition can be substantially free from rare earth oxides. Some embodiments of the invention can be characterized by the combined content of $Al_2O_3$ and rare earth oxides (i.e., $Al_2O_3+RE_2O_3$) present in the glass compositions. The $Al_2O_3+RE_2O_3$ content in some embodiments can be at least about 13 weight percent, based on the weight of the glass composition. In some embodiments, the $Al_2O_3+RE_2O_3$ content can be from about 13 to about 22 weight percent. In some embodiments, the $Al_2O_3+RE_2O_3$ content can be from about 14 to about 22 weight percent. In some embodiments, the $Al_2O_3+RE_2O_3$ content can be from about 14 to about 18 weight percent. In some embodiments, the $Al_2O_3+RE_2O_3$ content can be from about 18 to about 22 weight percent. It should be understood that any component of a glass composition described as being present in amount from about 0 weight percent to another weight percent is not necessarily required in all embodiments. In other words, such components may be optional in some embodiments, depending of course on the amounts of other components included in the compositions. Likewise, in some embodiments, glass compositions can be substantially free from such components, meaning that any amount of the component present in the glass composition would result from the component being present as a trace impurity in a batch material and would only be present in amounts of about weight percent or less.

As noted above, glass compositions, according to some embodiments of the present invention are fiberizable. In some embodiments, glass compositions of the present invention have forming temperatures ($T_F$) desirable for use in commercial fiber glass manufacturing operations. As used herein, the term "forming temperature" or $T_F$, means the temperature at which the glass composition has a viscosity of 1000 poise (or "log 3 temperature"). Glass compositions of the present invention, in some embodiments, have a $T_F$ ranging from about 1030° C. to about 1350° C. In another embodiment, glass compositions of the present invention have a $T_F$ ranging from about 1150° C. to about 1300° C.

Glass compositions of the present invention, in some embodiments, have a liquidus temperature ranging from about 1030° C. to about 1360° C. In another embodiment, glass compositions of the present invention have a liquidus temperature ranging from about 1155 to about 1255° C.

In some embodiments, the difference between the forming temperature and the liquidus temperature of a glass composition of the present invention is desirable for commercial fiber glass manufacturing operations. For example, for some embodiments of glass compositions, the difference between the forming temperature and the liquidus temperature ranges from about 35° C. to greater than 60° C. In some embodiments, the difference between the forming temperature and the liquidus temperature of a glass composition of the present invention is at least 65° C.

As provided herein, glass fibers can be formed from some embodiments of the glass compositions of the present invention. Thus, embodiments of the present invention can comprise glass fibers formed from any of the glass compositions described herein. In some embodiments, the glass fibers may be arranged into a fabric. In some embodiments, glass fibers of the present invention can be provided in other forms including, for example and without limitation, as continuous strands, chopped strands (dry or wet), yarns, rovings, prepregs, etc. In short, various embodiments of the glass compositions (and any fibers formed therefrom) can be used in a variety of applications.

Glass fibers of the present invention can be prepared in the conventional manner well known in the art, by blending the raw materials used to supply the specific oxides that form the composition of the fibers. Glass fibers according to the various embodiments of the present invention can be formed using any process known in the art for forming glass fibers, and more desirably, any process known in the art for forming essentially continuous glass fibers. For example, although not limiting herein, the glass fibers according to non-limiting embodiments of the present invention can be formed using direct-melt or indirect-melt fiber forming methods. These methods are well known in the art and further discussion thereof is not believed to be necessary in view of the present disclosure. See, e.g., K. L. Loewenstein, *The Manufacturing Technology of Continuous Glass Fibers,* 3rd Ed., Elsevier, N.Y., 1993 at pages 47-48 and 117-234.

Some embodiments of the present invention relate to fiber glass strands. Some embodiments of the present invention relate to yarns comprising fiber glass strands. Some embodiments of yarns of the present invention are particularly suitable for weaving applications. In addition, some embodiments of the present invention relate to glass fiber fabrics. Some embodiments of fiber glass fabrics of the present invention are particularly suitable for use in reinforcement applications, especially reinforcement applications in which high modulus, high strength, and/or high elongation are important. Further, some embodiments of the present invention relate to composites that incorporate fiber glass strands, fiber glass yarns, and fiber glass fabrics, such as fiber reinforced polymer composites. Still further, some embodiments of the present invention relate to fiber reinforced composites for applications, including, but not limited to wind energy, automotive, safety/security, aerospace, aviation, and high pressure tanks. Some embodiments of the present invention relate to printed circuit boards where lower coefficients of thermal expansion are particularly desirable, such as substrates for chip packaging.

Some embodiments of the present invention relate to fiber glass strands. In some embodiments, a fiber glass strand of the present invention comprises a plurality of glass fibers comprising a glass composition that comprises the following components:

| $SiO_2$ | from about 50 to about 55 weight percent; |
|---|---|
| $B_2O_3$ | from about 17 to about 26 weight percent; |
| $Al_2O_3$ | from about 13 to about 19 weight percent; |
| $MgO$ | from about 0 to about 8.5 weight percent; |
| $ZnO$ | from about 0 to about 7.5 weight percent; |
| $CaO$ | from about 0 to about 6 weight percent; |
| $Li_2O$ | from about 0 to about 1.5 weight percent; |
| $F_2$ | from about 0 to about 1.5 weight percent; |
| $Na_2O$ | from about 0 to about 1 weight percent; |
| $Fe_2O_3$ | from about 0 to about 1 weight percent; |
| $TiO_2$ | from about 0 to about 1 weight percent; and other constituents from about 0 to about 8 weight percent total. |

A number of other glass compositions are disclosed herein as part of the present invention, and other embodiments of the present invention relate to fiber glass strands formed from such compositions.

In some embodiments, glass fibers of the present invention can exhibit desirable mechanical and other properties. Glass fibers of the present invention, in some embodiments, can exhibit one or more improved mechanical properties relative to glass fibers formed from L-glass. Examples of improved desirable properties exhibited by some embodiments of glass fibers of the present invention include, without limitation, dielectric constant, coefficient of thermal expansion, melting and forming temperatures, transition temperature, fiber strength, Young's modulus, density, and boron emission.

Glass fibers of the present invention can have desirable dielectric constant (Dk) values in some embodiments. In some embodiments, fibers formed from glass compositions of the present invention can have a dielectric constant less than 5 (at 1 GHz). In some embodiments, glass fibers of the present invention can have a dielectric constant less than 4.75 (at 1 GHz). Fibers formed from glass compositions of the present invention can have a dielectric constant less than 4.0 (at 1 GHz) in some embodiments. Unless otherwise stated herein, dielectric constant values discussed herein are determined using the procedure set forth in the Examples section below.

Glass fibers of the present invention can have desirable thermal expansion coefficient (CTE) values in some embodiments. In some embodiments, fibers formed from glass compositions of the present invention can have a CTE less than 3.5 ppm/° C. In some embodiments, glass fibers of the present invention can have a CTE less than 3.3 ppm/° C. Fibers formed from glass compositions of the present invention can have a CTE less than 3.2 ppm/° C. in some embodiments. Unless otherwise stated herein, CTE values discussed herein are determined using the procedure set forth in the Examples section below.

Fiber glass strands can comprise glass fibers of various diameters, depending on the desired application. In some embodiments, a fiber glass strand of the present invention comprises at least one glass fiber having a diameter between about 5 and about 24 μm. In other embodiments, the at least one glass fiber has a diameter between about 5 and about 10 μM.

In some embodiments, fiber glass strands of the present invention can be formed into yarn and rovings. Rovings can comprise assembled, multi-end, or single-end direct draw rovings. Rovings comprising fiber glass strands of the present invention can comprise direct draw single-end rovings having various diameters and densities, depending on the desired application. In some embodiments, a roving comprising fiber glass strands of the present invention exhibits a density up to about 113 yards/pound.

Some embodiments of the present invention relate to yarns comprising at least one fiber glass strand as disclosed herein. In some embodiments, a yarn of the present invention comprises at least one fiber glass strand as disclosed herein, wherein the at least one fiber glass strand is at least partially coated with a sizing composition. In some embodiments, the sizing composition is compatible with a thermosetting polymeric resin. In other embodiments, the sizing composition can comprise a starch-oil sizing composition.

Yarns can have various linear mass densities, depending on the desired application. In some embodiments, a yarn of the present invention has a linear mass density from about 5,000 yards/pound to about 10,000 yards/pound.

Yarns can have various twist levels and directions, depending on the desired application. In some embodiments, a yarn of the present invention has a twist in the z direction of about 0.5 to about 2 turns per inch. In other embodiments, a yarn of the present invention has a twist in the z direction of about 0.7 turns per inch.

Yarns can be made from one or more strands that are twisted together and/or plied, depending on the desired application. Yarns can be made from one or more strands that are twisted together but not plied; such yarns are known as "singles." Yarns of the present invention can be made from one or more strands that are twisted together but not plied. In some embodiments, yarns of the present invention comprise 1-4 strands twisted together. In other embodiments, yarns of the present invention comprise 1 twisted strand.

Some embodiments of the present invention relate to fabrics comprising at least one fiber glass strand. In some embodiments, a fabric of the present invention can comprise at least one fiber glass strand comprising at least one of the glass compositions disclosed herein as part of the present invention. In some embodiments, a fabric of the present invention comprises a yarn as disclosed herein. Fabrics of the present invention, in some embodiments, can comprise at least one fill yarn comprising at least one fiber glass strand as disclosed herein. Fabrics of the present invention, in some embodiments, can comprise at least one warp yarn comprising at least one fiber glass strand as disclosed herein. In some embodiments, a fabric of the present invention comprises at least one fill yarn comprising at least one fiber glass strand as disclosed herein and at least one warp yarn comprising at least one fiber glass strand as disclosed herein.

In some embodiments of the present invention comprising a fabric, the glass fiber fabric is a fabric woven in accordance with industrial fabric style no. 7781. In other embodiments, the fabric comprises a plain weave fabric, a twill fabric, a crowfoot fabric, a satin weave fabric, a stitch bonded fabric (also known as a non-crimp fabric), or a "three-dimensional" woven fabric.

Embodiments of the present invention may further include articles of manufacture comprising an embodiment of a glass composition and/or an embodiment of a glass fiber of the present invention. In some embodiments, an article of manufacture comprises: an embodiment of a yarn of the present invention; an embodiment of a fabric of the present invention; and/or an embodiment of a composite of the present invention, Some embodiments of articles of manufacture of the present invention relate to printed circuit boards. In some embodiments, a printed circuit board comprises a yarn, a fabric and/or a composite of the present invention. Methods for manufacturing printed circuit boards are generally known to those of ordinary skill in the art.

Some embodiments of the present invention relate to composites. In some embodiments, a composite of the present invention comprises a polymeric resin and a plurality of glass fibers disposed in the polymeric resin, wherein at least one of the plurality of glass fibers comprises any of the glass compositions disclosed herein as part of the present invention. In some embodiments, a composite of the present invention comprises a polymeric resin and at least one fiber glass strand as disclosed herein disposed in the polymeric resin. In some embodiments, a composite of the present invention comprises a polymeric resin and at least a portion of a roving comprising at least one fiber glass strand as disclosed herein disposed in the polymeric resin. In other embodiments, a composite of the present invention comprises a polymeric resin and at least one yarn as disclosed herein disposed in the polymeric resin. In still other embodiments, a composite of the present invention comprises a polymeric resin and at least one fabric as disclosed herein disposed in the polymeric resin. In some embodiments, a composite of the present invention comprises at least one fill yarn comprising at least one fiber glass strand as disclosed herein and at least one warp yarn comprising at least one fiber glass strand as disclosed herein.

Composites of the present invention can comprise various polymeric resins, depending on the desired properties and applications. In some embodiments of the present invention comprising a composite, the polymeric resin comprises an epoxy resin. In other embodiments of the present invention comprising a composite, the polymeric resin can comprise polyethylene, polypropylene, polyamide, polyimide, polybutylene terephthalate, polycarbonate, thermoplastic polyurethane, phenolic, polyester, vinyl ester, polydicyclopentadiene, polyphenylene sulfide, polyether ether ketone, cyanate esters, bis-maleimides, and thermoset polyurethane resins. The invention will be illustrated through the following series of specific embodiments. However, it will be understood by one of skill in the art that many other embodiments are contemplated by the principles of the invention.

EXAMPLES

Table 1 provides a plurality of fiberizable glass compositions according to various embodiments of the present invention as well as data relating to various properties of such compositions.

The glasses in these examples were made by melting mixtures of commercial and reagent grade chemicals (reagent grade chemicals were used only for the rare earth oxides) in powder form in 10% Rh/Pt crucibles at the temperatures between 1500° C. and 1600° C. (2732° F.-2822° F.) for four hours. Each batch was about 1000 grams. After the 4 hour melting period, the molten glass was poured onto a steel plate for quenching. Volatile species of boron and fluoride were adjusted in the batches for their emission loss. The compositions in the examples represent as-batched compositions with the above adjustments. Commercial ingredients were used in preparing the glasses. In the batch calculations, special raw material retention factors were considered to calculate the oxides in each glass. The retention factors are based on years of glass batch melting and oxides yield in the glass as measured. Hence, the as-batched compositions illustrated in the examples are considered to be close to the measured compositions.

TABLE 1

| Example | 1 | 2 | 3 | 4 | 5 | 6 |
|---|---|---|---|---|---|---|
| $SiO_2$ | 52.76 | 52.91 | 53.84 | 53.52 | 53.02 | 53.04 |
| $Al_2O_3$ | 14.77 | 14.82 | 14.55 | 14.46 | 14.68 | 16.65 |
| $Fe_2O_3$ | 0.22 | 0.22 | 0.22 | 0.22 | 0.23 | 0.26 |
| CaO | 5.14 | 5.15 | 3.19 | 3.17 | 0.17 | 0.17 |
| MgO | 2.00 | 2.01 | 4.18 | 4.15 | 7.73 | 7.91 |
| $Na_2O$ | 0.04 | 0.04 | 0.04 | 0.04 | 0.04 | 0.05 |
| ZnO | 0.00 | 0.00 | 0.00 | 0.00 | 0.00 | 0.00 |
| $B_2O_3$ | 23.46 | 22.83 | 22.38 | 22.25 | 22.52 | 20.34 |
| $F_2$ | 1.11 | 1.11 | 1.10 | 1.09 | 1.12 | 1.01 |
| $TiO_2$ | 0.50 | 0.50 | 0.49 | 0.49 | 0.50 | 0.57 |
| $Li_2O$ | 0.01 | 0.41 | 0.00 | 0.61 | 0.00 | 0.00 |
| $SO_3$ | 0.00 | 0.00 | 0.00 | 0.00 | 0.00 | 0.00 |
| $Y_2O_3$ | 0.00 | 0.00 | 0.00 | 0.00 | 0.00 | 0.00 |
| $La_2O_3$ | 0.00 | 0.00 | 0.00 | 0.00 | 0.00 | 0.00 |
| TOTAL | 100.00 | 100.00 | 100.00 | 100.00 | 100.00 | 100.00 |
| $T_F$ (° C.) | 1314 | 1295 | 1350 | 1288 | 1298 | 1297 |
| $T_L$ (° C.) | 1088 | 1024 | 1067 | 1041 | 1130 | 1186 |
| $\Delta T$ (° C.) | 226 | 271 | 283 | 247 | 168 | 111 |
| $T_M$ (° C.) | 1541 | 1526 | 1584 | 1521 | 1540 | 1516 |
| $T_{soft}$ (° C.) | 909 | 852 | | | | 867 |
| $T_g$ (° C.) | 625 | 598 | 636 | | 655 | 666 |
| $D_k$ | 4.57 | 4.80 | 4.60 | 4.79 | 4.68 | |
| $D_f$ | 0.0008 | 0.0012 | 0.0009 | 0.0016 | 0.0011 | |
| CTE (ppm/° C.) | 3.32 | 3.47 | 3.21 | | 3.28 | 3.04 |
| E (GPa) | 62.0 | 60.6 | | 64.0 | 63.8 | 67.0 |
| Density (g/cm³) | 2.293 | 2.288 | | 2.306 | 2.304 | 2.322 |

| Example | 7 | 8 | 9 | 10 | 11 | 12 |
|---|---|---|---|---|---|---|
| $SiO_2$ | 52.01 | 53.18 | 54.15 | 52.83 | 53.03 | 53.00 |
| $Al_2O_3$ | 17.01 | 17.40 | 17.71 | 14.82 | 14.76 | 14.45 |
| $Fe_2O_3$ | 0.26 | 0.27 | 0.28 | 0.23 | 0.21 | 0.20 |
| CaO | 0.17 | 0.18 | 0.18 | 0.14 | 4.19 | 5.13 |
| MgO | 8.08 | 8.26 | 8.41 | 6.37 | 0.08 | 0.09 |
| $Na_2O$ | 0.05 | 0.05 | 0.05 | 0.04 | 0.04 | 0.04 |
| ZnO | 0.00 | 0.00 | 0.00 | 0.00 | 2.22 | 2.17 |
| $B_2O_3$ | 20.79 | 19.01 | 17.53 | 22.78 | 23.85 | 23.34 |
| $F_2$ | 1.03 | 1.05 | 1.07 | 1.12 | 1.12 | 1.09 |
| $TiO_2$ | 0.59 | 0.60 | 0.61 | 0.50 | 0.50 | 0.49 |
| $Li_2O$ | 0.00 | 0.00 | 0.00 | 1.16 | 0.01 | 0.01 |
| $SO_3$ | 0.00 | 0.00 | 0.00 | 0.00 | 0.00 | 0.00 |
| $Y_2O_3$ | 0.00 | 0.00 | 0.00 | 0.00 | 0.00 | 0.00 |
| $La_2O_3$ | 0.00 | 0.00 | 0.00 | 0.00 | 0.00 | 0.00 |
| TOTAL | 100.00 | 100.00 | 100.00 | 100.00 | 100.00 | 100.00 |
| $T_F$ (° C.) | 1273 | 1296 | 1307 | 1256 | 1333 | 1330 |
| $T_L$ (° C.) | 1182 | 1192 | 1193 | 1081 | 1157 | 1167 |
| $\Delta T$ (° C.) | 91 | 104 | 114 | 175 | 176 | 163 |
| $T_M$ (° C.) | 1489 | 1513 | 1520 | 1483 | 1563 | 1559 |
| $T_{soft}$ (° C.) | 932 | | 924 | | | |
| $T_g$ (° C.) | 668 | 673 | 675 | 592 | 624 | 616 |
| $D_k$ | | | | 4.89 | 4.58 | 4.73 |
| $D_f$ | | | | 0.0024 | 0.0006 | 0.0008 |
| CTE (ppm/° C.) | 3.05 | 3.02 | 3.12 | 3.42 | 3.16 | 3.12 |
| E (GPa) | 66.1 | 69.3 | 69.3 | 65.5 | 57.2 | 58.4 |
| Density (g/cm³) | 2.321 | 2.339 | 2.349 | 2.292 | 2.283 | 2.299 |

| Example | 13 | 14 | 15 | 16 | 17 | 18 |
|---|---|---|---|---|---|---|
| $SiO_2$ | 52.79 | 52.97 | 52.98 | 52.93 | 52.91 | 52.87 |
| $Al_2O_3$ | 14.69 | 14.44 | 14.68 | 14.79 | 14.75 | 14.73 |
| $Fe_2O_3$ | 0.21 | 0.20 | 0.20 | 0.22 | 0.21 | 0.21 |
| CaO | 4.17 | 2.17 | 0.00 | 2.16 | 0.07 | 2.57 |

TABLE 1-continued

| | | | | | | |
|---|---|---|---|---|---|---|
| MgO | 0.08 | 0.05 | 0.02 | 3.22 | 3.20 | 1.01 |
| $Na_2O$ | 0.04 | 0.04 | 0.04 | 0.04 | 0.04 | 0.04 |
| ZnO | 2.21 | 5.21 | 7.15 | 1.11 | 3.58 | 3.58 |
| $B_2O_3$ | 23.74 | 23.34 | 23.33 | 23.32 | 23.05 | 23.39 |
| $F_2$ | 1.11 | 1.09 | 1.09 | 1.12 | 1.11 | 1.10 |
| $TiO_2$ | 0.50 | 0.49 | 0.50 | 0.50 | 0.50 | 0.50 |
| $Li_2O$ | 0.45 | 0.00 | 0.00 | 0.58 | 0.58 | 0.00 |
| $SO_3$ | 0.00 | 0.00 | 0.00 | 0.00 | 0.00 | 0.00 |
| $Y_2O_3$ | 0.00 | 0.00 | 0.00 | 0.00 | 0.00 | 0.00 |
| $La_2O_3$ | 0.00 | 0.00 | 0.00 | 0.00 | 0.00 | 0.00 |
| | | | | | | |
| TOTAL | 100.00 | 100.00 | 100.00 | 100.00 | 100.00 | 100.00 |
| $T_F$ (° C.) | 1309 | 1330 | 1326 | 1288 | 1327 | 1323 |
| $T_L$ (° C.) | 1173 | 1297 | 1354 | 1130 | 1298 | 1295 |
| $\Delta T$ (° C.) | 136 | 33 | −28 | 158 | 29 | 28 |
| $T_M$ (° C.) | 1543 | 1561 | 1568 | 1517 | 1562 | 1579 |
| $T_{soft}$ (° C.) | | | | 848 | 849 | 908 |
| $T_g$ (° C.) | 585 | | | 598 | 644 | 632 |
| $D_k$ | 4.74 | 4.54 | 4.48 | 4.79 | 4.55 | 4.50 |
| $D_f$ | 0.0008 | 0.0007 | 0.0006 | 0.0014 | 0.0009 | 0.0007 |
| CTE (ppm/° C.) | 3.24 | | | 3.33 | 3.02 | 2.97 |
| E (GPa) | 58.0 | 55.9 | | 60.8 | 58.6 | 56.8 |
| Density ($g/cm^3$) | 2.292 | 2.316 | | 2.305 | 2.317 | 2.311 |

| Example | 19 | 20 | 21 | 22 | 23 | 24 |
|---|---|---|---|---|---|---|
| $SiO_2$ | 53.82 | 52.28 | 50.16 | 52.98 | 52.91 | 52.91 |
| $Al_2O_3$ | 13.35 | 15.75 | 16.44 | 14.68 | 14.75 | 14.75 |
| $Fe_2O_3$ | 0.20 | 0.24 | 0.25 | 0.20 | 0.21 | 0.21 |
| CaO | 3.34 | 3.57 | 3.73 | 0.00 | 0.07 | 0.07 |
| MgO | 3.34 | 3.80 | 3.97 | 0.02 | 3.20 | 3.20 |
| $Na_2O$ | 0.04 | 0.04 | 0.04 | 0.04 | 0.04 | 0.04 |
| ZnO | 3.34 | 3.56 | 3.72 | 0.00 | 0.00 | 0.00 |
| $B_2O_3$ | 21.11 | 19.27 | 20.13 | 23.33 | 23.05 | 23.05 |
| $F_2$ | 1.00 | 0.94 | 0.98 | 1.09 | 1.11 | 1.11 |
| $TiO_2$ | 0.45 | 0.54 | 0.57 | 0.50 | 0.50 | 0.50 |
| $Li_2O$ | 0.00 | 0.00 | 0.00 | 0.00 | 0.58 | 0.58 |
| $SO_3$ | 0.00 | 0.00 | 0.00 | 0.00 | 0.00 | 0.00 |
| $Y_2O_3$ | 0.00 | 0.00 | 0.00 | 0.00 | 0.00 | 3.58 |
| $La_2O_3$ | 0.00 | 0.00 | 0.00 | 7.15 | 3.58 | 0.00 |
| | | | | | | |
| TOTAL | 100.00 | 100.00 | 100.00 | 100.00 | 100.00 | 100.00 |
| $T_F$ (° C.) | 1315 | 1287 | 1265 | 1362 | 1322 | 1311 |
| $T_L$ (° C.) | 1122 | 1157 | 1157 | | 1246 | 1243 |
| $\Delta T$ (° C.) | 193 | 130 | 108 | | 76 | 68 |
| $T_M$ (° C.) | 1542 | 1496 | 1471 | 1593 | 1552 | 1543 |
| $T_{soft}$ (° C.) | 873 | 867 | | 815 | 851 | 840 |
| $T_g$ (° C.) | 631 | 643 | 640 | 616 | 619 | 625 |
| $D_k$ | 4.73 | 4.87 | 5.01 | 4.51 | 4.66 | 4.61 |
| $D_f$ | 0.0010 | 0.0012 | 0.0012 | 0.0009 | 0.0007 | 0.0007 |
| CTE (ppm/° C.) | 3.16 | 2.69 | 3.21 | 3 | 3.12 | 3.1 |
| E (GPa) | 61.5 | 65.4 | 66.0 | 55.0 | 61.1 | 61.2 |
| Density ($g/cm^3$) | 2.342 | 2.380 | 2.391 | 2.341 | 2.312 | 2.306 |

| Example | 25 | 26 | 27 | 28 | 29 | 30 |
|---|---|---|---|---|---|---|
| $SiO_2$ | 52.21 | 51.93 | 52.05 | 52.25 | 53.52 | 53.16 |
| $Al_2O_3$ | 14.04 | 14.69 | 14.51 | 14.34 | 15.70 | 16.26 |
| $Fe_2O_3$ | 0.22 | 0.23 | 0.22 | 0.22 | 0.23 | 0.23 |
| CaO | 3.61 | 3.79 | 3.83 | 3.77 | 1.94 | 1.98 |
| MgO | 5.07 | 5.04 | 4.76 | 4.76 | 3.06 | 1.84 |
| $Na_2O$ | 0.04 | 0.04 | 0.04 | 0.04 | 0.04 | 0.04 |
| ZnO | 0.00 | 0.00 | 0.00 | 0.00 | 0.00 | 0.00 |
| $B_2O_3$ | 23.32 | 22.80 | 23.10 | 23.13 | 23.90 | 24.80 |
| $F_2$ | 1.00 | 0.98 | 0.99 | 0.99 | 1.07 | 1.11 |
| $TiO_2$ | 0.48 | 0.50 | 0.50 | 0.49 | 0.54 | 0.56 |
| $Li_2O$ | 0.00 | 0.00 | 0.00 | 0.00 | 0.00 | 0.00 |
| $SO_3$ | 0.00 | 0.00 | 0.00 | 0.00 | 0.00 | 0.00 |
| $Y_2O_3$ | 0.00 | 0.00 | 0.00 | 0.00 | 0.00 | 0.00 |
| $La_2O_3$ | 0.00 | 0.00 | 0.00 | 0.00 | 0.00 | 0.00 |
| | | | | | | |
| TOTAL | 100.00 | 100.00 | 100.00 | 100.00 | 100.00 | 100.00 |
| $T_F$ (° C.) | 1278 | 1274 | 1279 | 1285 | 1326 | 1327 |
| $T_L$ (° C.) | 1048 | 1035 | 1032 | 1035 | 1307 | >1350 |
| $\Delta T$ (° C.) | 230 | 239 | 247 | 250 | 19 | |

TABLE 1-continued

| | | | | | | |
|---|---|---|---|---|---|---|
| $T_M$ (° C.) | 1492 | 1484 | 1492 | 1498 | 1546 | 1553 |
| $T_{soft}$ (° C.) | | | | | | |
| $T_g$ (° C.) | | | | | | |
| $D_k$ | 4.82 | 4.89 | 4.83 | 4.85 | 4.62 | 4.54 |
| $D_f$ | 0.0011 | 0.0013 | 0.0012 | 0.0011 | 0.0010 | 0.0008 |
| CTE (ppm/° C.) | | | | | | |
| E (GPa) | | | | | | |
| Density (g/cm³) | | | | | | |

| Example | 31 | 32 | 33 | 34 |
|---|---|---|---|---|
| $SiO_2$ | 52.91 | 52.32 | 52.56 | 52.31 |
| $Al_2O_3$ | 16.67 | 18.42 | 14.51 | 14.83 |
| $Fe_2O_3$ | 0.23 | 0.26 | 0.20 | 0.21 |
| CaO | 2.01 | 3.07 | 4.05 | 3.81 |
| MgO | 0.98 | 1.10 | 0.57 | 0.07 |
| $Na_2O$ | 0.04 | 0.05 | 0.04 | 0.04 |
| ZnO | 0.00 | 0.00 | 2.36 | 3.02 |
| $B_2O_3$ | 25.44 | 22.89 | 23.74 | 23.70 |
| $F_2$ | 1.13 | 1.25 | 1.07 | 1.09 |
| $TiO_2$ | 0.57 | 0.63 | 0.50 | 0.51 |
| $Li_2O$ | 0.00 | 0.00 | 0.41 | 0.41 |
| $SO_3$ | 0.00 | 0.00 | 0.00 | 0.00 |
| $Y_2O_3$ | 0.00 | 0.00 | 0.00 | 0.00 |
| $La_2O_3$ | 0.00 | 0.00 | 0.00 | 0.00 |
| TOTAL | 100.00 | 100.00 | 100.00 | 100.00 |
| $T_F$ (° C.) | 1325 | 1320 | 1186 | 1158 |
| $T_L$ (° C.) | >1350 | >1350 | 1325 | 1317 |
| $\Delta T$ (° C.) | | | 139 | 159 |
| $T_M$ (° C.) | 1556 | 1532 | 1562 | 1554 |
| $T_{soft}$ (° C.) | | | | |
| $T_g$ (° C.) | | | | |
| $D_k$ | 4.44 | 4.69 | 4.73 | 4.74 |
| $D_f$ | 0.0006 | 0.0007 | 0.0005 | 0.0005 |
| CTE (ppm/° C.) | | | | |
| E (GPa) | | | | |
| Density (g/cm³) | | | | |

Melt Properties

Melt viscosity as a function of temperature and liquidus temperature was determined by using ASTM Test Method C965 "Standard Practice for Measuring Viscosity of Glass Above the Softening Point," and C829 "Standard Practices for Measurement of Liquidus Temperature of Glass by the Gradient Furnace Method," respectively. Glass softening was determined by using ASTM C338-93(2008) "Standard Test Method for Softening Point of Glass."

Table 1 includes measured liquidus temperature ($T_L$), reference temperature of forming ($T_F$) defined by melt viscosity of 1000 Poise, and reference temperature of melting ($T_M$) defined by viscosity of 100 Poise, for the glass compositions. The difference between the forming temperature and the liquidus temperature ($\Delta T$) is also shown.

Thermal Properties

Linear coefficient of thermal expansion of the glasses were determined by using ASTM Test Method E228-11 "Standard Test Method for Linear Thermal Expansion of Solid Materials With a Push-Rod Dilatometer." By using the same method, glass transition temperature, $T_g$, of the glass was determined.

Electrical Properties

Dielectric constant ($D_k$) and dissipation factor ($D_f$) of each glass were determined at frequency of 1 GHz by using ASTM Test Method D150 "Standard Test Methods for A-C Loss Characteristics and Permittivity (Dielectric Constant) of Solid Electrical Insulating Materials." A polished disk of each glass sample with 40 mm diameter and 1-1.5 mm thickness was used for $D_k$ and $D_f$ measurements at 1 GHz frequency using Agilent E4991A RF Impedance/Material Analyzer.

Mechanical Properties

Young's modulus was also measured for certain glass compositions in Table 1 using the following technique. Approximately 50 grams of glass cullet having a composition corresponding to the appropriate example in Table 1 was re-melted in a 90 Pt/10 Rh crucible for two hours at a melting temperature defined by 100 Poise. The crucible was subsequently transferred into a vertical tube, electrically heated furnace. The furnace temperature was preset at a fiber pulling temperature close or equal to a 1000 Poise melt viscosity. The glass was equilibrated at the temperature for one hour before fiber drawing. The top of the fiber drawing furnace had a cover with a center hole, above which a water-cooled copper coil was mounted to regulate the fiber cooling. A silica rod was then manually dipped into the melt through the cooling coil, and a fiber about 1-1.5 m long was drawn out and collected. The diameter of the fiber ranged from 100 μm at one end to 1000 μm at the other end.

Elastic moduli were determined using an ultrasonic acoustic pulse technique (Panatherm 5010 unit from Panametrics, Inc. of Waltham, Massachusetts) for the fibers drawn from the glass melts. Extensional wave reflection time was obtained using twenty micro-second duration, 200 kHz pulses. The sample length was measured and the respective extensional wave velocity ($V_E$) was calculated. Fiber density (ρ) was measured using a Micromeritics AccuPyc 1330 pycnometer. About 20 measurements were made for each composition, and the average Young's modulus (E) was calculated from the following formula:

$$E = V_E^2 \times \rho$$

The modulus tester uses a wave guide with a diameter of 1 mm, which sets the fiber diameter at the contact side with the wave guide to be about the same as the wave guide diameter. In other words, the end of the fiber having a diameter of 1000 μm was connected at the contact side of the wave guide. Fibers with various diameters were tested for Young's modulus and the results show that a fiber diameter from 100 to 1000 μm does not affect fiber modulus. Specific modulus values were calculated by dividing the Young's modulus values by the corresponding densities.

It is to be understood that the present description illustrates aspects of the invention relevant to a clear understanding of the invention. Certain aspects of the invention that would be apparent to those of ordinary skill in the art and that, therefore, would not facilitate a better understanding of the invention have not been presented in order to simplify the present description. Although the present invention has been described in connection with certain embodiments, the present invention is not limited to the particular embodiments disclosed, but is intended to cover modifications that are within the spirit and scope of the invention.

That which is claimed is:

1. A glass composition suitable for fiber forming comprising:

$SiO_2$ in an amount from 50 to 55 weight percent;

$B_2O_3$ in an amount from 17 to 26 weight percent;

$Al_2O_3$ in an amount from 13 to 19 weight percent;

MgO in an amount from 0 to 8.5 weight percent;

ZnO in an amount from 0 to 7.5 weight percent;

CaO in an amount from 0 to 6 weight percent;

$Li_2O$ in an amount from 0 to 1.5 weight percent;

$F_2$ in an amount from 0 to 1.5 weight percent;

$Na_2O$ in an amount from 0 to 1 weight percent;

$Fe_2O_3$ in an amount from 0 to 1 weight percent;

$TiO_2$ in an amount from 0 to 1 weight percent;

$CeO_2$ in an amount less than 0.2 weight percent; and

BaO in an amount less than 0.1 weight percent.

2. The composition of claim 1, wherein the $B_2O_3$ content is from 17.5 to 25 weight percent.

3. The composition of claim 1, wherein the MgO content is from greater than 0 to 7.5 weight percent.

4. The composition of claim 1, wherein the MgO content is from 2 to 8.5 weight percent.

5. The composition of claim 1, wherein the CaO content is from greater than 0 to 5.5 weight percent.

6. The composition of claim 1, wherein the $Li_2O$ content is 0.8 weight percent or less.

7. The composition of claim 1, wherein the $Li_2O$ content is from greater than 0 to 0.8 weight percent.

8. The composition of claim 1, wherein the $F_2$ content is from greater than 0 to 1.5 weight percent.

9. The composition of claim 1, wherein the $TiO_2$ content is from greater than 0 to 0.7 weight percent.

10. The composition of claim 1, wherein the ZnO content is from greater than 0 to 5 weight percent.

11. The composition of claim 1, wherein the $Fe_2O_3$ content is from greater than 0 to 0.5 weight percent.

12. The composition of claim 1, wherein the composition is substantially free from SrO.

13. The composition of claim 1, wherein the MgO+CaO content is 9 weight percent or less.

14. The composition of claim 1, wherein the MgO+CaO content is from greater than 0 to 9 weight percent.

15. The composition of claim 1, wherein the $Al_2O_3$+MgO content is from 14 to 26 weight percent.

16. The composition of claim 1, wherein the total $Na_2O$+ $Li_2O$ content is 1.5 weight percent or less.

17. The composition of claim 1, wherein the $Al_2O_3$+ZnO content is from 14 to 22 weight percent.

18. A fiber formed from the composition of claim 1.

19. An article of manufacture comprising the fiber of claim 18.

20. The article of manufacture of claim 19, wherein the article is a printed circuit board.

* * * * *